US011610855B2

(12) United States Patent
Chew

(10) Patent No.: US 11,610,855 B2
(45) Date of Patent: *Mar. 21, 2023

(54) CHIP PACKAGING METHOD AND PACKAGE STRUCTURE

(71) Applicant: PEP INNOVATION PTE. LTD., Singapore (SG)

(72) Inventor: Jimmy Chew, Singapore (SG)

(73) Assignee: PEP INNOVATION PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/805,851

(22) Filed: Mar. 2, 2020

(65) Prior Publication Data

US 2020/0203296 A1 Jun. 25, 2020

Related U.S. Application Data

(63) Continuation-in-part of application No. 15/826,268, filed on Nov. 29, 2017, now Pat. No. 11,049,734.

(30) Foreign Application Priority Data

Mar. 4, 2019 (SG) .......................... 10201901893Q
Mar. 11, 2019 (SG) .......................... 10201902149Q (Continued)

(51) Int. Cl.
*H01L 23/00* (2006.01)
*H01L 23/29* (2006.01)
(Continued)

(52) U.S. Cl.
CPC ............ *H01L 24/05* (2013.01); *H01L 21/561* (2013.01); *H01L 21/568* (2013.01); *H01L 21/78* (2013.01);
(Continued)

(58) Field of Classification Search
CPC ......... H01L 24/24; H01L 24/19; H01L 24/20; H01L 24/32; H01L 24/73; H01L 24/82; (Continued)

(56) References Cited

U.S. PATENT DOCUMENTS 6,396,159 B1 5/2002 Shoji
8,293,576 B2 10/2012 Chino
(Continued)

FOREIGN PATENT DOCUMENTS

CN 103383927 11/2013
CN 103515252 1/2014
(Continued)

*Primary Examiner* — Thanhha S Pham
(74) *Attorney, Agent, or Firm* — Javalon Law, PC.

(57) ABSTRACT

The present disclosure provides a chip packaging method and a package structure. The chip packaging method comprises: forming a wafer conductive layer on a wafer active surface of a wafer; forming a protective layer having certain material properties on the wafer conductive layer, the protective layer encapsulating the wafer conductive layer and exposing a front surface of the wafer conductive layer; separating (such as cutting) the wafer formed with the wafer conductive layer and the protective layer to form a die; attaching (such as adhering) the die onto a carrier; forming a molding layer having certain material properties on a die back surface of the die on the carrier; removing (such as stripping off) the carrier; forming a panel-level conductive layer electrically connected with the wafer conductive layer; and forming a dielectric layer. The package structure has a series of structural and material properties, so as to reduce warpage in the packaging process, lower a requirement on an accuracy of aligning the die, reduce a difficulty in the packaging process, and make the packaged chip more durable, and thus the present disclosure is especially suitable for large panel-level package and package of a thin chip with a large electric flux.

19 Claims, 8 Drawing Sheets

(30) Foreign Application Priority Data

Mar. 19, 2019 (SG) .......................... 10201902426V
Jul. 19, 2019 (CN) ......................... 201910657495.8

(51) Int. Cl.
*H01L 23/31* (2006.01)
*H01L 21/56* (2006.01)
*H01L 21/78* (2006.01)

(52) U.S. Cl.
CPC ........ *H01L 23/295* (2013.01); *H01L 23/3135* (2013.01); *H01L 24/13* (2013.01); *H01L 24/24* (2013.01); *H01L 2224/02311* (2013.01); *H01L 2224/02331* (2013.01); *H01L 2224/02379* (2013.01); *H01L 2224/02381* (2013.01); *H01L 2224/13024* (2013.01); *H01L 2224/24101* (2013.01); *H01L 2224/24137* (2013.01)

(58) Field of Classification Search
CPC ............... H01L 23/295; H01L 23/3107; H01L 23/3114; H01L 23/3121; H01L 23/3135; H01L 23/3171; H01L 23/3185; H01L 24/96; H01L 2023/4037; H01L 2023/405; H01L 23/49568
See application file for complete search history.

(56) References Cited

U.S. PATENT DOCUMENTS

| | | | |
|---|---|---|---|
| 8,848,380 | B2 | 9/2014 | Malatkar et al. |
| 9,793,230 | B1 * | 10/2017 | Yu ....................... H01L 23/3185 |
| 9,870,975 | B1 * | 1/2018 | Wang .................. H01L 23/3736 |
| 10,431,477 | B2 | 10/2019 | Chew |
| 2009/0152715 | A1 | 6/2009 | Shim et al. |
| 2009/0261466 | A1 | 10/2009 | Pagaila et al. |
| 2010/0140779 | A1 | 6/2010 | Lin et al. |
| 2011/0026232 | A1 | 2/2011 | Lin et al. |
| 2011/0241222 | A1 | 10/2011 | Sezi et al. |
| 2011/0278741 | A1 | 11/2011 | Chua et al. |
| 2012/0119373 | A1 | 5/2012 | Hunt |
| 2012/0313238 | A1 * | 12/2012 | Sato ....................... H01L 21/568 257/737 |
| 2013/0241048 | A1 | 9/2013 | Lin et al. |
| 2013/0295725 | A1 | 11/2013 | Park et al. |
| 2013/0341784 | A1 | 12/2013 | Lin et al. |
| 2014/0023885 | A1 * | 1/2014 | Choi ....................... H01M 2/34 429/7 |
| 2014/0027885 | A1 | 1/2014 | Kawase et al. |
| 2014/0027929 | A1 | 1/2014 | Lin et al. |
| 2014/0042638 | A1 | 2/2014 | Liu et al. |
| 2015/0137162 | A1 * | 5/2015 | Sabathil .................. H01L 33/54 257/98 |
| 2015/0145142 | A1 | 5/2015 | Lin et al. |
| 2015/0162289 | A1 | 6/2015 | Chang et al. |
| 2015/0179616 | A1 | 6/2015 | Lin et al. |
| 2015/0206855 | A1 * | 7/2015 | Lin ...................... H01L 25/0655 257/738 |
| 2015/0243607 | A1 | 8/2015 | Jang et al. |
| 2015/0314941 | A1 | 11/2015 | Ramadas et al. |
| 2016/0155713 | A1 | 6/2016 | Kim et al. |
| 2016/0276307 | A1 | 9/2016 | Lin |
| 2016/0322337 | A1 * | 11/2016 | Liang ...................... H01L 24/19 |
| 2016/0338202 | A1 | 11/2016 | Park et al. |
| 2016/0343697 | A1 | 11/2016 | Lee et al. |
| 2017/0005057 | A1 * | 1/2017 | Hurwitz .................. H01L 24/97 |
| 2017/0084589 | A1 * | 3/2017 | Kuo ..................... H01L 23/3128 |
| 2017/0133334 | A1 | 5/2017 | Kim et al. |
| 2017/0250171 | A1 | 8/2017 | Yu et al. |
| 2017/0309571 | A1 | 10/2017 | Yi et al. |
| 2017/0365566 | A1 | 12/2017 | Lee et al. |
| 2018/0006058 | A1 * | 1/2018 | Lee ..................... H01L 27/1218 |
| 2018/0033782 | A1 * | 2/2018 | Jeng ...................... H01L 24/20 |
| 2018/0082917 | A1 | 3/2018 | Cheng et al. |
| 2018/0166396 | A1 | 6/2018 | Lee et al. |
| 2018/0190513 | A1 | 7/2018 | Chew |
| 2018/0204741 | A1 | 7/2018 | Chew |
| 2018/0268188 | A1 | 9/2018 | Zhang et al. |
| 2018/0269188 | A1 | 9/2018 | Yu et al. |
| 2020/0212018 | A1 * | 7/2020 | Lai ....................... H01L 23/367 |

FOREIGN PATENT DOCUMENTS

| | | |
|---|---|---|
| CN | 105304586 | 2/2016 |
| TW | 201327744 A | 7/2013 |
| TW | 201830621 | 8/2018 |
| TW | 201832297 | 9/2018 |
| TW | 201834085 | 9/2018 |
| TW | 201834086 A | 9/2018 |
| TW | 201834088 A | 9/2018 |
| TW | 201900761 A | 1/2019 |
| TW | M589895 | 1/2020 |
| TW | M589897 | 1/2020 |

\* cited by examiner

CHIP PACKAGING METHOD AND PACKAGE STRUCTURE

CROSS-REFERENCE TO RELATED APPLICATIONS

This application is a continuation-in-part application of co-pending U.S. patent application Ser. No. 15/826,268 entitled "Method of Packaging Chip and Chip Package Structure", filed on Nov. 29, 2017, and cross-references to co-pending U.S. patent application Ser. No. 16/805,846 entitled "Chip Packaging Method and Package Structure", filed on Mar. 2, 2020, co-pending U.S. patent application Ser. No. 16/805,850 entitled "Chip Packaging Method and Package Structure", filed on Mar. 2, 2020 and co-pending U.S. patent application Ser. No. 16/805,853 entitled "Chip Packaging Method and Chip Structure", filed on Mar. 2, 2020. All disclosures are herein incorporated by reference in their entireties for all purposes.

TECHNICAL FIELD

The present disclosure relates to a field of semiconductor technologies, and more particularly, to a chip packaging method and a package structure.

BACKGROUND

Panel-level package is a process of cutting a wafer to separate out a plurality of dies, arranging and adhering the dies onto a carrier, and simultaneously packaging the plurality of dies in a same process. The panel-level package has received wide attention as a technique emerging in recent years; and as compared with traditional wafer-level package, the panel-level package has advantages of high production efficiency, low production costs, and better applicability to mass production.

However, numerous technical barriers exist in the panel-level package, for example, a warpage problem of the panel, an accuracy of alignment of the die on the panel, and so on.

Especially under a current trend that electronic devices become smaller and lighter, small and thin chips are increasingly favored by the market; however, difficulties in packaging the small and thin chips by using a large panel packaging technique should not be underestimated.

SUMMARY

According to various embodiments, there is provided a chip package structure, comprising: at least one die, the at least one die including a die active surface and a die back surface; a conductive structure, including a wafer conductive layer and a panel-level conductive layer; a protective layer; a molding layer, the molding layer encapsulating the at least one die; and a dielectric layer.

According to various embodiments, there is provided a chip packaging method, comprising: forming a wafer conductive layer on a wafer active surface of a wafer to be packaged; forming a protective layer on the wafer conductive layer, the protective layer encapsulating the wafer conductive layer and exposing a front surface of the wafer conductive layer; separating (such as cutting) the wafer formed with the wafer conductive layer and the protective layer to form a die; attaching (such as adhering) the die onto a carrier, a die active surface of the die facing a carrier front surface of the carrier and a die back surface of the die facing away from the carrier front surface; forming a molding layer on the die back surface on the carrier; removing (such as stripping off) the carrier; forming a panel-level conductive layer electrically connected with the wafer conductive layer; and forming a dielectric layer.

BRIEF DESCRIPTION OF THE DRAWINGS

FIG. 1 to FIG. 13 are schematic diagrams of a chip packaging method according to an exemplary embodiment of the present disclosure, in which:

FIG. 1 is a schematic diagram of a wafer according to the exemplary embodiment of the present disclosure;

FIG. 2 is a schematic diagram of the wafer formed with wafer conductive traces according to the exemplary embodiment of the present disclosure;

FIG. 3 is a schematic diagram of the wafer formed with wafer conductive studs according to the exemplary embodiment of the present disclosure;

FIG. 5 is a schematic diagram of cutting the wafer to form a die according to the exemplary embodiment of the present disclosure;

FIG. 7 is a schematic diagram of forming a molding layer on the carrier according to the exemplary embodiment of the present disclosure;

FIG. 9 is a schematic diagram of stripping off the carrier and an adhesive layer according to the exemplary embodiment of the present disclosure;

FIG. 10 is a schematic diagram of forming conductive traces on a panel assembly according to the exemplary embodiment of the present disclosure;

FIG. 11 is a schematic diagram of forming conductive studs on the panel assembly according to the exemplary embodiment of the present disclosure;

FIG. 13 is a schematic diagram of cutting the panel assembly to obtain a packaged chip according to the exemplary embodiment of the present disclosure;

DETAILED DESCRIPTION

In order to make the technical solution of the present disclosure clearer and the technical effect more apparent, preferred embodiments of the present disclosure will be described and explained in detail below in conjunction with the accompanying drawings; it cannot be understood that the description below is the only implementation form of the present disclosure or a limitation to the present disclosure.

FIG. 1 to FIG. 13 are schematic diagrams of a chip packaging method according to an exemplary embodiment of the present disclosure.

Figure 1:
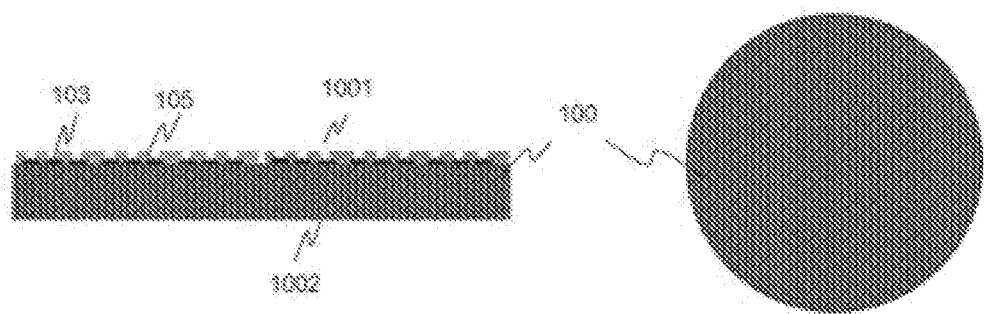

As shown in FIG. 1, at least one wafer 100 is provided; the wafer 100 has a wafer active surface 1001 and a wafer back surface 1002; the wafer 100 includes a plurality of dies 113, and active surfaces of the dies constitutes the wafer active surface 1001; the active surface of each die in the wafer 100 forms active components and passive components by using a series of processes such as doping, deposition and etching, etc.; the active components include diodes and triodes, etc.; the passive components include voltage elements, capacitors, resistors and inductors, etc.; and these active components and passive components are connected by connection wires to form a functional circuit, so as to implement various functions. The wafer active surface 1001 further includes an electrical connection pad 103 for leading out the functional circuit and an insulating layer 105 for protecting the electrical connection pad 103.

Figure 2:
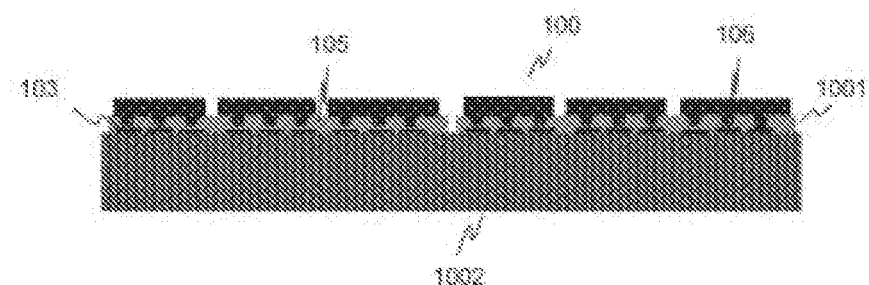

As shown in FIG. 2, a wafer conductive trace 106 is formed on the wafer active surface 1001.

The wafer conductive trace 106 for example comprises a material such as copper, gold, silver, tin, aluminum and the like, or a combination thereof, or other suitable conductive materials by PVD, CVD, sputtering, electrolytic electroplating, electrodeless electroplating, or other suitable metal deposition processes.

At least one of the wafer conductive traces 106 interconnects and leads out a plurality of electrical connection pads 103 of at least a part of the electrical connection pads 103.

At least one of the wafer conductive traces 106 respectively lead out at least a part of the electrical connection pads 103.

Figure 3:
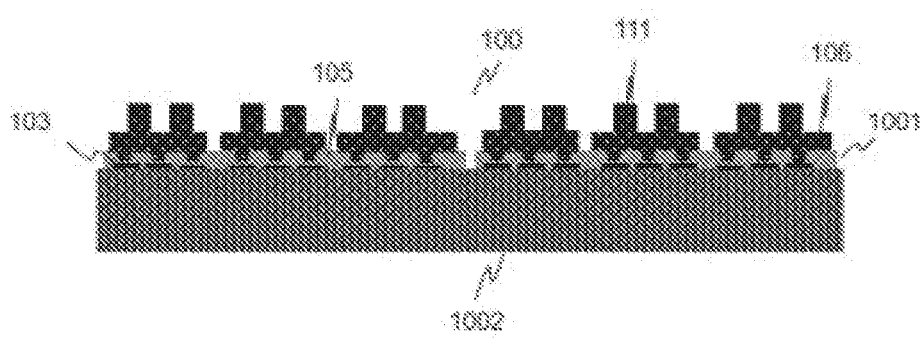

As shown in FIG. 3, a wafer conductive stud 111 is formed on a pad (or also known as a connection point) of the wafer conductive trace 106.

The wafer conductive stud 111 for example has a shape of a circle, or may have other shape such as an ellipse, a square, a line and the like. The wafer conductive stud 111 for example is formed of one or more layers of a material such as copper, gold, silver, tin, aluminum and the like, or a combination thereof, or other suitable conductive material by PVD, CVD, sputtering, electrolytic electroplating, electrodeless electroplating, or other suitable metal deposition process.

Optionally, the wafer conductive stud 111 is directly formed on the electrical connection pad 103 provided on the wafer active surface 1001 and leads out the electrical connection pad 103.

The wafer conductive trace 106 and/or the wafer conductive stud 111 are referred to as the wafer conductive layer.

Figure 4A:
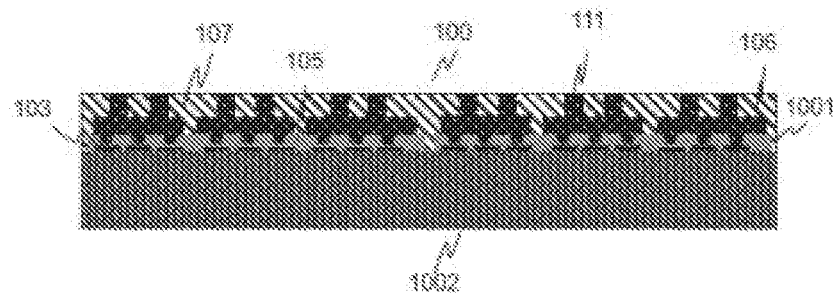
FIG. 4a, FIG. 4b and FIG. 4c are schematic diagrams of the wafer applied with a protective layer according to the exemplary embodiment of the present disclosure.
Figure 4B:
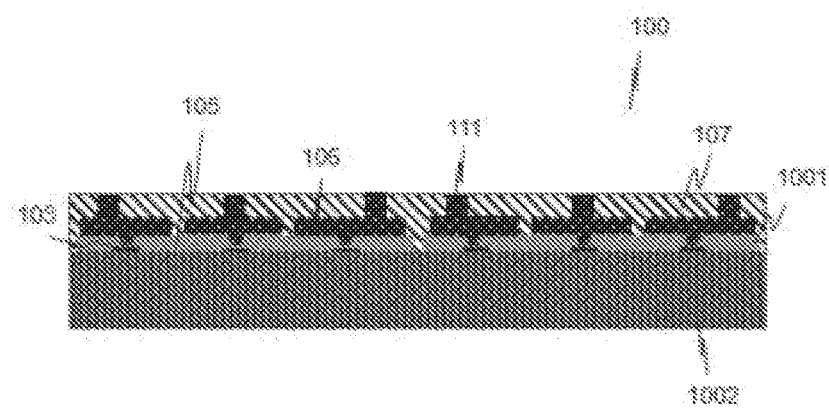
Figure 4C:
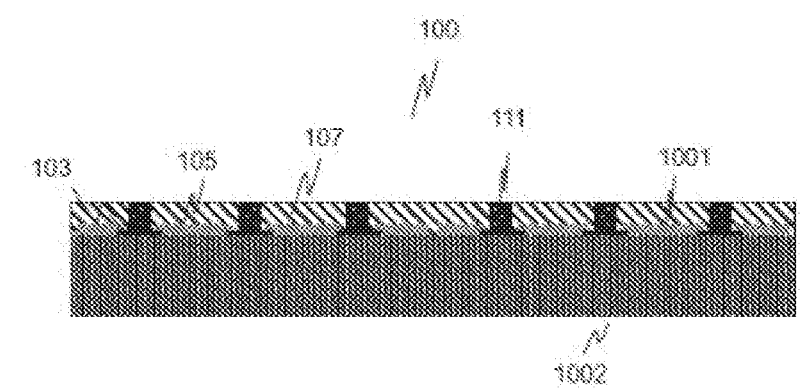

As shown in FIG. 4a, FIG. 4b and FIG. 4c, a protective layer 107 is applied on the wafer conductive layer.

As shown in FIG. 4a, the wafer conductive layer includes the wafer conductive trace 106 and the wafer conductive stud 111; at least one of the wafer conductive traces 106 interconnects and leads out a plurality of electrical connection pads 103 of at least a part of the electrical connection pads 103; and the protective layer 107 is applied on the wafer conductive trace 106 and the wafer conductive stud 111 to encapsulate the wafer conductive trace 106 and the wafer conductive stud 111.

As shown in FIG. 4b, the wafer conductive layer includes the wafer conductive trace 106 and the wafer conductive stud 111, at least one of the wafer conductive traces 106 respectively lead out at least a part of the electrical connection pads 103; and the protective layer 107 is applied on the wafer conductive trace 106 and the wafer conductive stud 111 to encapsulate the wafer conductive trace 106 and the wafer conductive stud 111.

As shown in FIG. 4c, the wafer conductive layer includes only the wafer conductive stud 111, and the wafer conductive stud 111 is formed at the electrical connection pad 103. The protective layer 107 is applied on the wafer conductive stud 111 to encapsulate the wafer conductive stud 111.

The protective layer 107 is made of an insulating material, optionally, for example, benzocyclobutene (BCB), polyimide (PI), polybenzoxazole (PBO), polymer-based dielectric film, organic polymer film, or is made of other material having similar insulation and structural properties, by lamination, coating and printing, etc.

In one embodiment, the protective layer is applied by lamination.

In one embodiment, the protective layer 107 is applied so that the protective layer 107 completely encapsulates the wafer conductive layer; in this case, the protective layer 107 is thinned to expose a surface of the wafer conductive layer after the application process of the protective layer 107;

In another embodiment, the applied protective layer 107 has a thickness to just expose the surface of the wafer conductive layer.

Optionally, before the step of applying the protective layer 107, the wafer active surface 1001 formed with the wafer conductive layer and/or the surface, which is to be applied to the wafer 100, of the protective layer 107 are physically and/or chemically treated, so that the protective layer 107 and the wafer 100 are bonded together more closely. The treatment optionally is plasma surface treatment to roughen the surface so as to increase the bonding area and/or chemically-promoting modifier treatment of introducing the chemically-promoting modifier group (for example, the surface modifier comprising both the group having affinity with the organic substance and the group having affinity with the inorganic substance) between the wafer 100 and the protective layer 107 so as to increase the bonding force at the interface between the organic layer and the inorganic layer.

The protective layer 107 protects the die active surface 1131 during a subsequent molding process.

A bonding effect between the die 113 and an adhesive layer 121 is strengthened due to the presence of the protective layer 107, so that during the molding process, a package pressure is not easy to cause position shift of the die 113 on a carrier 117.

In a preferred embodiment, the protective layer 107 has a Young's modulus in a range of 1,000 MPa to 20,000 MPa; more preferably, the protective layer 107 has a Young's modulus in a range of 1,000 MPa to 10,000 MPa; further preferably, the protective layer 107 has a Young's modulus in a range of 1,000 MPa to 7,000 MPa, 4,000 MPa to 7,000 MPa, or 4,000 MPa to 8,000 MPa; and in a most preferred embodiment, the protective layer 107 has a Young's modulus of 5,500 MPa.

In a preferred embodiment, the protective layer 107 has a thickness in a range of 15 μm to 50 μm; more preferably, the protective layer 107 has a thickness in a range of 20 μm to 50 μm; in a preferred embodiment, the protective layer 107 has a thickness of 35 μm; in another preferred embodiment, the protective layer 107 has a thickness of 45 μm; and in still another preferred embodiment, the protective layer 107 has a thickness of 50 μm.

The protective layer 107 has the Young's modulus in the range of 1,000 MPa to 20,000 MPa; on one hand, the protective layer 107 is soft and has good flexibility and elasticity; on the other hand, the protective layer provides sufficient supporting force so that the protective layer 107 provides sufficient support for a conductive layer formed on the surface of the protective layer 107. Meanwhile, the protective layer 107 has the thickness in the range of 15 μm to 50 μm, it is ensured that the protective layer 107 provides sufficient buffering and support.

Particularly, in some types of chips, it is required not only that a thin die is packaged, but also that the conductive layer has a certain thickness suitable for a large electric flux; at this time, it is selected that the protective layer 107 has the thickness in the range of 15 μm to 50 μm and has the Young's modulus in the range of 1,000 MPa to 10,000 MPa. The soft and flexible protective layer 107 forms a buffer layer between the die 113 and the conductive layer formed on the surface of the protective layer, so that the conductive layer on the surface of the protective layer does not excessively press the die 113 and the die 113 is prevented from being broken under pressure of the thick and heavy conductive layer during the chip is used. Meanwhile, the protective layer 107 has a sufficient strength, so that the protective layer 107 provides sufficient support for the thick and heavy conductive layer.

In the case that the protective layer 107 has the Young's modulus in the range of 1,000 MPa to 20,000 MPa, especially in the case that the protective layer 107 has the Young's modulus in the range of 4,000 MPa to 8,000 MPa and has the thickness in the range of 20 μm to 50 μm, due to material properties of the protective layer 107, the protective layer 107 effectively protects the die against a pressure from a pin of a die bonder machine during a subsequent process of transferring the die.

The die transferring process is a reconstruction process of arranging and adhering the die 113 which has underwent the cutting and separating process onto the carrier 117; the die transferring process adopts the die bonder machine; the die bonder machine includes the pin; the die 113 on the wafer 100 is jacked up by the pin, and the die 113 which is jacked up is sucked by a bonder head, and then is transferred and bonded to the carrier 117.

During the process that the pin jacks up the die 113, the die 113, especially the thin die 113, is brittle and is easily broken under the jacking pressure of the pin, so the protective layer 107 having the above material properties protects the brittle die 113 to maintain integrity of the die 113 even under a relatively large jacking pressure.

In a preferred embodiment, the protective layer 107 is an organic/inorganic composite material layer including filler particles. For example, the filler particles are inorganic oxide particles. For example, the filler particles are $SiO_2$ particles. In one embodiment, the filler particles in the protective layer 107 are two or more different types of inorganic oxide particles, for example, $SiO_2$ particles and $TiO_2$ particles mixed with each other. Preferably, the filler particles in the protective layer 107 such as the inorganic oxide particles, e.g., $SiO_2$ particles, e.g., $SiO_2$ particles and $TiO_2$ particles mixed with each other, are spherical or spheroidal. In a preferred embodiment, the filler particles in the protective layer 107 such as the inorganic oxide particles, e.g., $SiO_2$ particles, e.g., $SiO_2$ particles and $TiO_2$ particles mixed with each other, have a fill amount of 50% or more.

An organic material has advantages of easy operation and easy application, and the die 113 to be packaged is made of an inorganic material such as silicon; if the protective layer 107 is only made of the organic material, a difference between material properties of the organic material and material properties of the inorganic material may increase a difficulty in the packaging process and affect a packaging effect. By employing the organic/inorganic composite material in which the inorganic particles are added to the organic material, the material properties of the organic material is modified, so that the material of the protective layer 107 has properties of both the organic material and the inorganic material.

In a preferred embodiment, in the case that T<Tg, the protective layer 107 has a coefficient of thermal expansion in a range of 3 ppm/K to 10 ppm/K; in a preferred embodiment, the protective layer 107 has a coefficient of thermal expansion of 5 ppm/K; in a preferred embodiment, the protective layer 107 has a coefficient of thermal expansion of 7 ppm/K; and in a preferred embodiment, the protective layer 107 has a coefficient of thermal expansion of 10 ppm/K.

In a subsequent molding process, the die 113 applied with the protective layer 107 expands and contracts correspondingly during heating and cooling processes of the molding process; in the case that the protective layer 107 has the coefficient of thermal expansion in the range of 3 ppm/K to 10 ppm/K, the protective layer 107 and the die 113 maintain a relatively uniform degree of expansion and contraction, so that an interface stress is not easily caused at a bonding interface between the protective layer 107 and the die 113, and thus the bonding between the protective layer 107 and the die 113 is not easily destroyed and the packaged chip structure is more stable.

The chip after being packaged often needs to undergo a thermal cycle during being used; in the case that the protective layer 107 has the coefficient of thermal expansion in the range of 3 ppm/K to 10 ppm/K, which is the same as or similar to the coefficient of thermal expansion of the die 113, the protective layer 107 and the die 113 maintain a relatively uniform degree of expansion and contraction in the thermal cycle, so that accumulation of interface fatigue at the interface between the protective layer 107 and the die 113 is avoided, and thus the packaged chip becomes more durable and a service life of the packaged chip is prolonged.

On the other hand, if the coefficient of thermal expansion of the protective layer is further reduced, the composite material of the protective layer 107 has to be filled with too many filler particles and the Young's modulus of the material is increased while the coefficient of thermal expansion is further reduced, so that the flexibility of the protective layer is reduced, resulting in excessively strong rigidity but a poor buffering effect of the protective layer 107. It is most preferable to limit the coefficient of thermal expansion of the protective layer to be 5 ppm/k to 10 ppm/k.

In a preferred embodiment, the protective layer 107 has a tensile strength in a range of 20 MPa to 50 MPa; and in a preferred embodiment, the protective layer 107 has a tensile strength of 37 MPa.

Optionally, after the process of applying the protective layer 107 to the wafer active surface 1001, the wafer back surface 1002 is ground to thin the wafer 100 to a desired thickness.

Modern electronic devices are small and lightweight, and thus the chip has a tendency of becoming thinner; in the step, the wafer 100 sometimes needs to be thinned to a very small thickness. However, it is very difficult to process and transfer the thin wafer 100, and a process of grinding and thinning the thin wafer 100 is also difficult, so it is usually difficult to thin the wafer 100 to a desired thickness. In the case that the surface of the wafer 100 has the protective layer 107, the protective layer 107 having the above material properties supports the wafer 100, so that the difficulties in processing, transferring and thinning the wafer 100 are reduced.

Firstly, the wafer conductive layer 170 and the protective layer 107 are formed on the wafer, and the electrical connection pad 103 is electrically connected with the wafer conductive layer 170; because the wafer conductive layer 170 is formed at the wafer level, an accuracy of alignment of the wafer conductive layer 170 with the electrical connection pad 103 is high; and during a subsequent step of forming a panel-level conductive layer 180, the wafer conductive layer 170 is electrically connected with the panel-level conductive layer 180, so that a tolerance of accuracy of routing the conductive traces is reduced and the conductive traces are arranged tighter.

Figure 5:
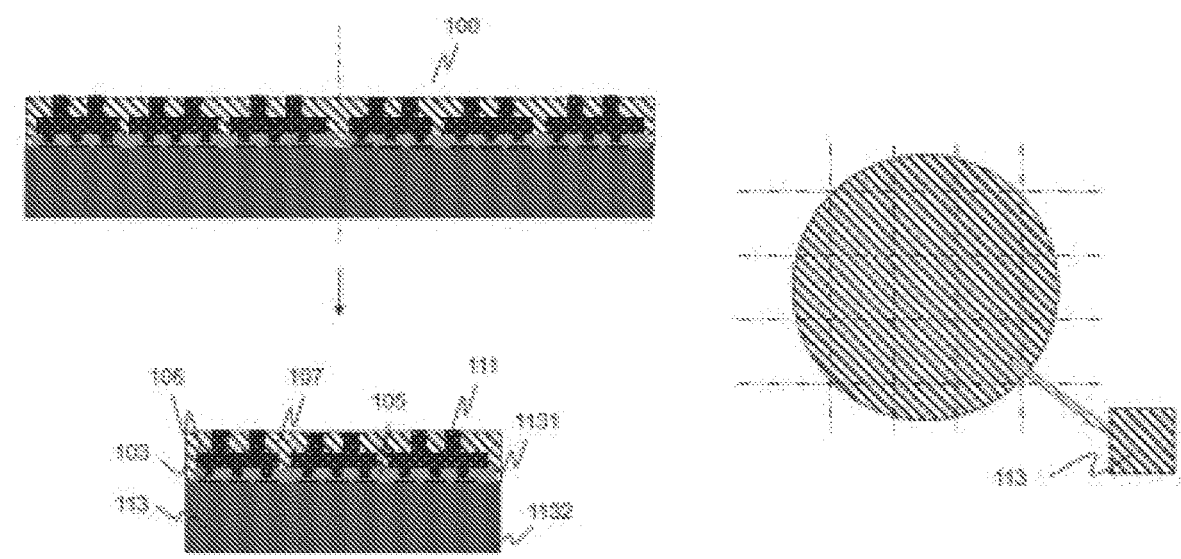

As shown in FIG. 5, the wafer 100 formed with the wafer conductive layer and applied with the protective layer 107 is cut along a cutting line to obtain a plurality of dies 113; and the die 113 has a die active surface 1131 and a die back surface 1132.

Due to the material properties of the protective layer, the die 113 which is separated out in the process of cutting the wafer 100 has no burrs and chippings.

In one embodiment, before the step of cutting the wafer 100 to separate out the dies 113, the method further comprises: performing plasma surface treatment on the surface, applied with the protective layer 107, of the wafer 100 to increase surface roughness, so that adhesiveness of the die 113 to the carrier 117 in a subsequent process is increased and thus position shift of the die under the package pressure is less likely to occur.

It should be understood that, if the process permits, the protective layer 107 for example is formed on the die active surface 1131 of each die 113 to be packaged after the wafer 100 formed with the wafer conductive layer is cut into the dies 113 to be packaged according to specific practical situations.

Figure 6A:
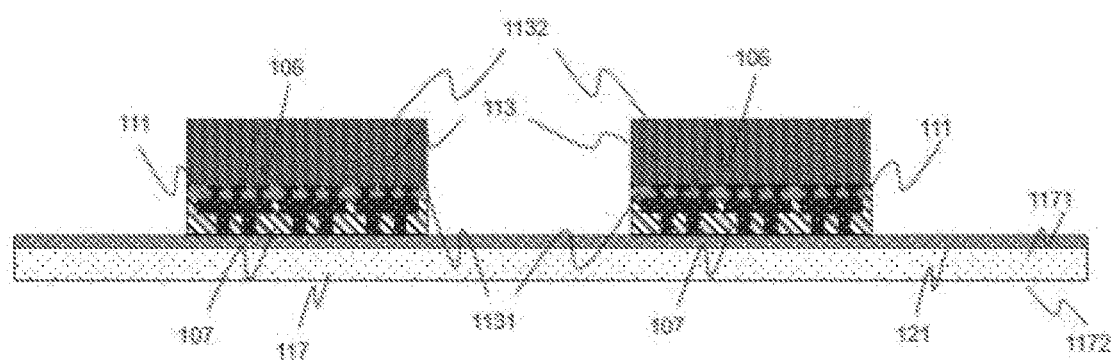
FIG. 6a is a schematic diagram of adhering the die onto a carrier according to the exemplary embodiment of the present disclosure.

As shown in FIG. 6a, the carrier 117 is provided, and the carrier 117 has a carrier front surface 1171 and a carrier back surface 1172; the die 113 separated out is arranged at a predetermined position on the carrier front surface 1171, the die active surface 1131 faces the carrier 117, and the die back surface 1132 faces away from the carrier 117.

The carrier 117 for example has a shape of a circle, a triangle, a quadrangle or any other shape; the carrier 117 for example has a size of a small-sized wafer substrate, or has various sizes, particularly is a large-sized rectangular carrier; and the carrier 117 for example is made of metal, non-metal, plastic, resin, glass and stainless steel, etc. Preferably, the carrier 117 is a large-sized quadrangular stainless steel panel.

The carrier 117 has the carrier front surface 1171 and the carrier back surface 1172, and the carrier front surface 1171 preferably is a flat surface.

In one embodiment, the die 113 is bonded and fixed onto the carrier 117 by the adhesive layer 121.

The adhesive layer 121 for example is formed on the carrier front surface 1171 by lamination, printing, spraying and coating, etc. In order to facilitate separation of the carrier 117 from the die 113 whose back side has been packaged in a subsequent process, the adhesive layer 121 is preferably made of a material capable of being easily separated, for example, a thermal-releasing material.

Preferably, a position mark for arranging the die 113 is previously formed on the carrier 117, the mark is formed on the carrier 117 by laser, mechanical patterning, etc., and meanwhile, an alignment mark is provided on the die 113 to aim for and align with a position for adhering on the carrier 117 during adhering.

Figure 6B:
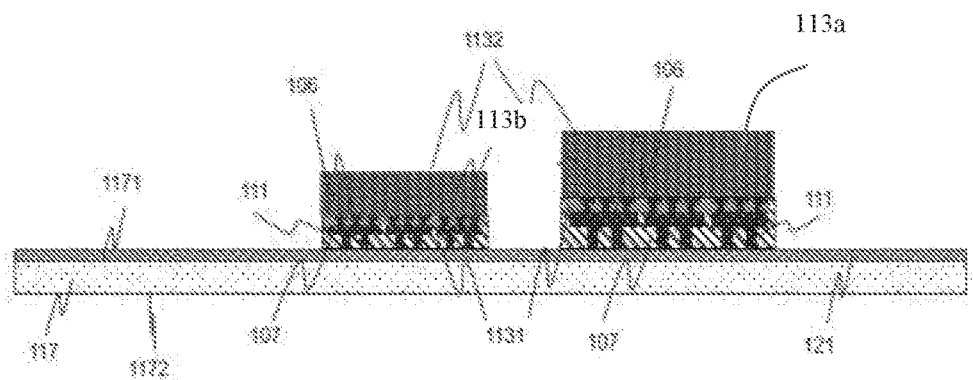
FIG. 6b is a schematic diagram of bonding a combination of dies onto the carrier according to the exemplary embodiment of the present disclosure.

Optionally, as shown in FIG. 6b, in a single packaging process, two dies 113a and 113b, particularly, two dies 113a and 113b having different functions (which are shown as two in the drawing, or may be more than two dies) are arranged on the carrier 117 according to actual product requirements, then are packaged, and further are cut into a plurality of package bodies after packaging is completed; and thus, one package body includes the two dies 113a and 113b so as to form a multi-chip module (MCM), and positions of two dies 113a and 113b may be freely set according to actual product requirements.

Figure 7:
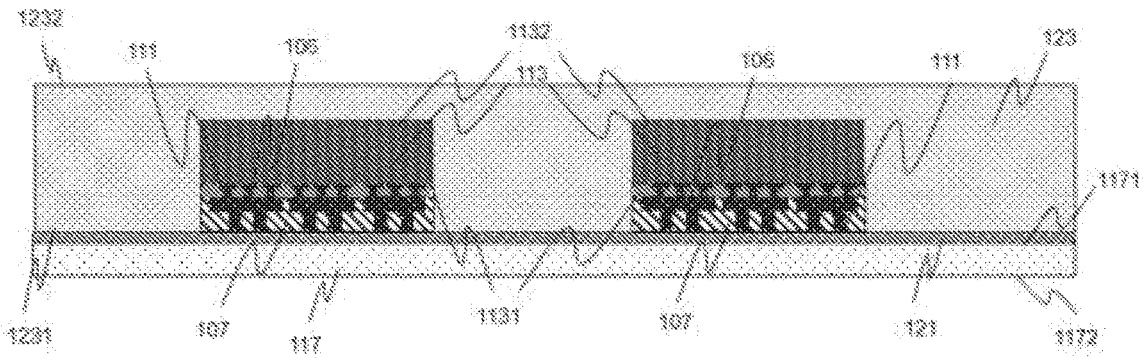

As shown in FIG. 7, a molding layer 123 is formed.

The molding layer 123 is formed on all exposed surface of the die 113 to be packaged and the exposed surface of the carrier front surface 1171 or the adhesive layer 121. The molding layer 123 is used to completely encapsulate the carrier front surface 1171 and the die 113, so as to reconstruct a flat-plate structure; after the carrier 117 is stripped off, a subsequent packaging step is continued on the reconstructed flat-plate structure.

A surface of the molding layer 123 that is in contact with the carrier front surface 1171 or the adhesive layer 121 is defined as a molding layer front surface 1231. A surface of the molding layer 123 that faces away from the carrier front surface 1171 or the adhesive layer 121 is defined as a molding layer back surface 1232.

Preferably, the molding layer front surface 1231 and the molding layer back surface 1232 are substantially flat and parallel to the carrier front surface 1171.

The molding layer 123 for example is formed by paste printing, injection molding, hot press molding, compression molding, transfer molding, liquid sealant molding, vacuum lamination, or other suitable mode of molding. The molding layer 123 for example comprises an organic composite material, a resin composite material, a macromolecule composite material, a polymer composite material, such as an epoxy resin having a filler, an Ajinomoto buildup film (ABF) or other polymer having a suitable filler.

In one embodiment, the molding layer 123 is made of an organic/inorganic composite material by compression molding.

Preferably, the molding layer 123 has a coefficient of thermal expansion in a range of 3 ppm/K to 10 ppm/K; in a preferred embodiment, the molding layer 123 has a coefficient of thermal expansion of 5 ppm/K; in another preferred embodiment; the molding layer 123 has a coefficient of thermal expansion of 7 ppm/K; and in still another preferred embodiment, the molding layer 123 has a coefficient of thermal expansion of 10 ppm/K.

Preferably, the molding layer 123 and the protective layer 107 have a substantially same coefficient of thermal expansion.

The coefficient of thermal expansion of the molding layer 123 is selected to be 3 ppm/K to 10 ppm/K, and is selected to be the same as or similar to the coefficient of thermal expansion of the protective layer 107; during heating and cooling processes of the molding process, the protective layer 107 and the molding layer 123 have a uniform degree of expansion and contraction, so that an interface stress is not easily caused between the protective layer 107 and the molding layer 123; and such low coefficient of thermal expansion of the molding layer allows the molding layer, the protective layer and the die to have coefficients of thermal expansion close to one another, so that the molding layer 123, the protective layer 107 and the die 113 are bonded closely at the interfaces therebetween, to avoid their separations at the interfaces therebetween.

The packaged chip usually needs to undergo the thermal cycle during being used; in the case that the protective layer 107, the molding layer 123 and the die 113 have coefficients of thermal expansion close to one another, the protective layer 107, the molding layer 123 and the die 113 have little interface fatigue in the thermal cycle, and an interface gap is less likely to occur between the protective layer 107, the molding layer 123 and the die 113, so that a service life of the chip is prolonged and an application field of the chip is widened.

A difference in the coefficients of thermal expansion between the die 113 and the molding layer 123 may cause warpage of the panel after the molding process is completed; due to the warpage phenomenon, it is difficult to accurately position the die 113 in the panel in a subsequent process of forming the conductive layer, which thus has a great impact on the process of forming the conductive layer.

Particularly, in a large panel packaging process, because a size of the panel is relatively large, even slight panel warpage may cause the die in an outer peripheral portion of the panel that is away from a center of the panel to generate a greater position change as compared with the position of the die before being molded; so in the large panel packaging process, solving the warpage problem becomes one of key points of the whole process; and the warpage problem even limits magnification development of the size of the panel and becomes a technical barrier in the packaging process of the large-sized panel.

The coefficients of thermal expansion of the protective layer 107 and the molding layer 123 are limited to the range of 3 ppm/K to 10 ppm/K, and preferably, the molding layer 123 and the protective layer 107 have the substantially same coefficient of thermal expansion, so that occurrence of warpage of the panel is effectively avoided and the packaging process of the large panel is implemented.

Meanwhile, during the molding process, because the package pressure exerts a pressure onto the back side of the die 113, the pressure tends to press the die 113 into the adhesive layer 121, so that the die 113 sinks into the adhesive layer 121 in the process of forming the molding layer 123; after the molding layer 123 is formed, the die 113 and the molding layer front surface 1231 are not located in a same plane, and the surface of the die 113 protrudes beyond the molding layer front surface 1231 to form a stepped structure; during a subsequent process of forming the conductive layer, the conductive trace 125 also has a corresponding stepped structure, which makes the package structure unstable.

In the case that the die active surface 1131 has the protective layer 107 with the above material properties, the protective layer 107 acts as a buffer under the package pressure to avoid the die 113 from sinking into the adhesive layer 121, so as to avoid generation of the stepped structure on the molding layer front surface 1231.

Figure 8A:
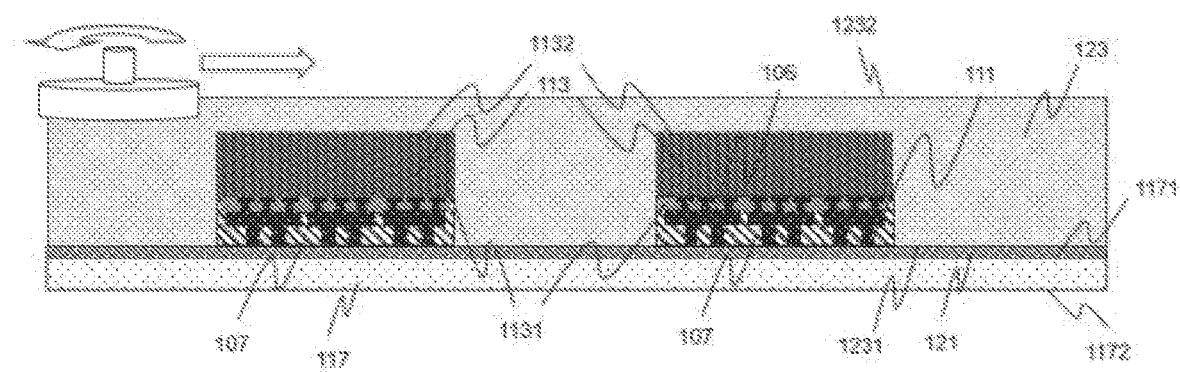
FIG. 8a is a schematic diagram of thinning the molding layer according to the exemplary embodiment of the present disclosure.

As shown in FIG. 8a, a thickness of the molding layer 123 is thinned by grinding or polishing the molding layer back surface 1232.

Figure 8B:
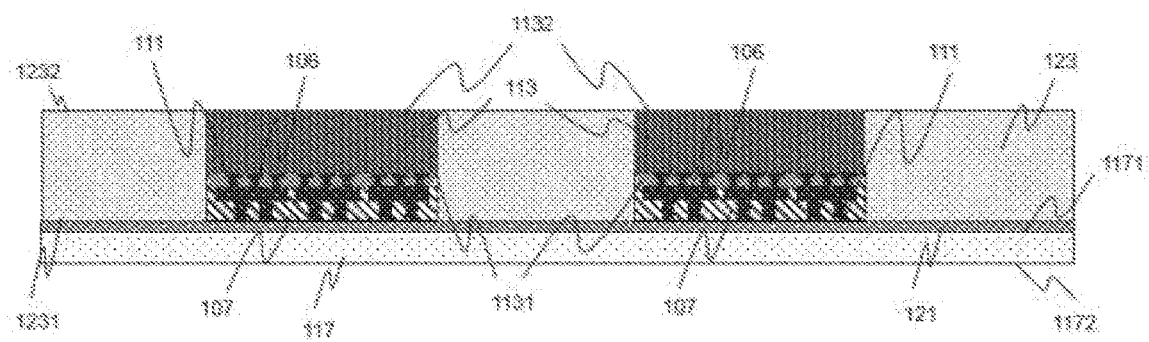
FIG. 8b is a schematic diagram of thinning the molding layer to expose a die back surface of the die according to the exemplary embodiment of the present disclosure.

In one embodiment, as shown in FIG. 8b, the thickness of the molding layer 123 is thinned to the die back surface 1132 of the die 113 to expose the die back surface 1132. The packaged chip structure is as shown in FIG. 14b.

Figure 9:
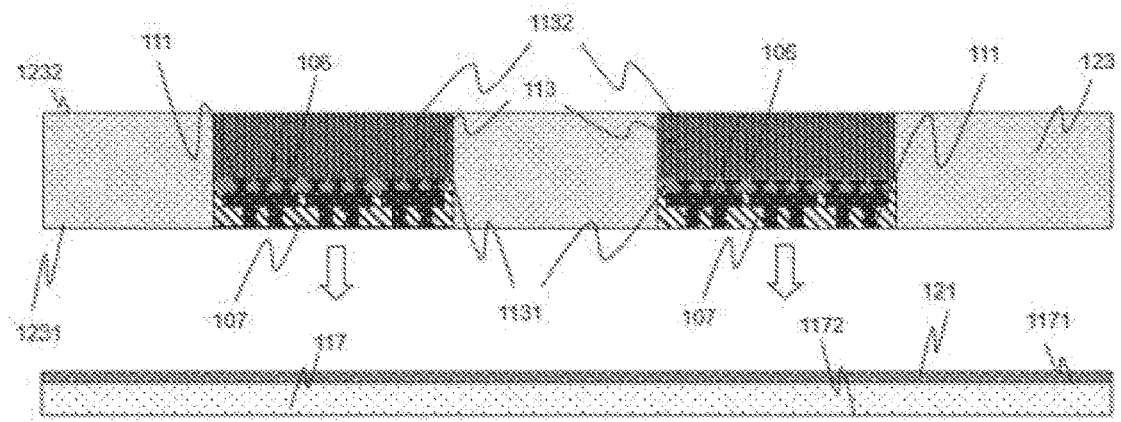

As shown in FIG. 9, the carrier 117 is stripped off to expose the molding layer front surface 1231, the protective layer 107, and the exposed surface of the wafer conductive layer.

After the carrier 117 is removed, a structure in which the molding layer 123 encapsulates the die 113 is defined as the panel assembly 150.

Figure 10:
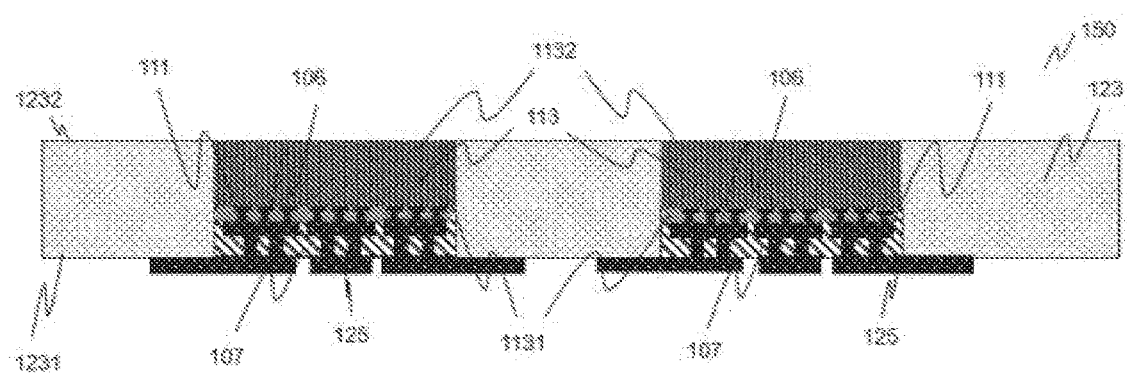
Figure 11:
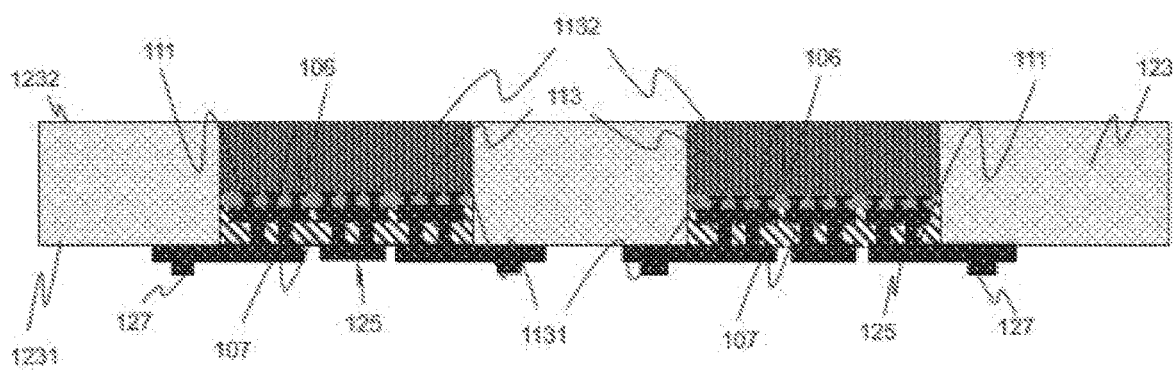

FIG. 10 and FIG. 11 show one embodiment of a process of forming a patterned panel-level conductive layer on the die 113 within the molding layer 123.

FIG. 10 shows that a conductive trace 125 is formed on the die 113 within the molding layer 123; at least a part of the conductive traces 125 are formed on the surface of the protective layer 107 provided on the die active surface 1131, and are electrically connected with at least one of the wafer conductive studs 111.

The conductive trace 125 for example is formed of one or more layers of a material such as copper, gold, silver, tin, aluminum and the like, or a combination thereof, or other suitable conductive material by PVD, CVD, sputtering, electrolytic electroplating, electrodeless electroplating, or other suitable metal deposition process.

Figure 14A:
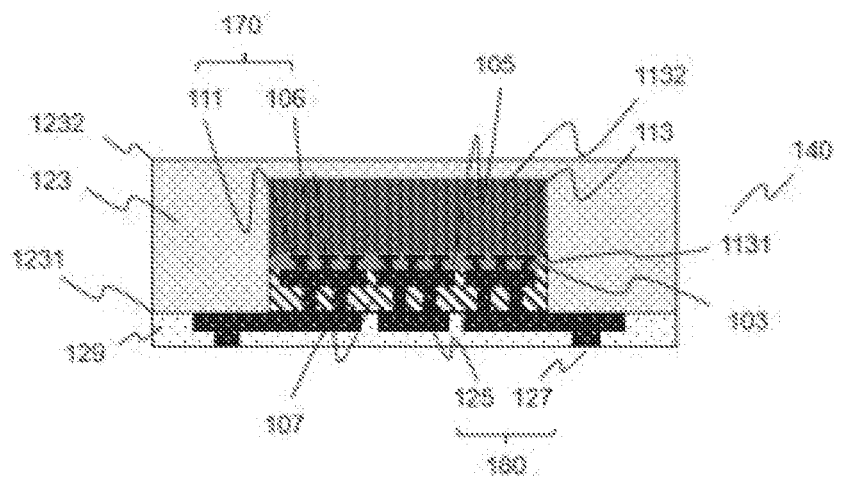
FIG. 14a, FIG. 14b, FIG. 14c, FIG. 14d and FIG. 14e are schematic diagrams of chip package structures obtained by using the above-described chip packaging method according to the exemplary embodiment of the present disclosure.
Figure 14B:
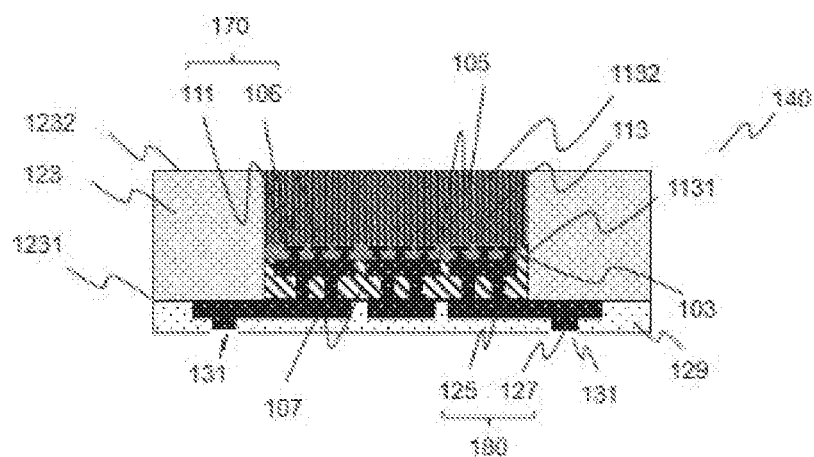
Figure 14C:
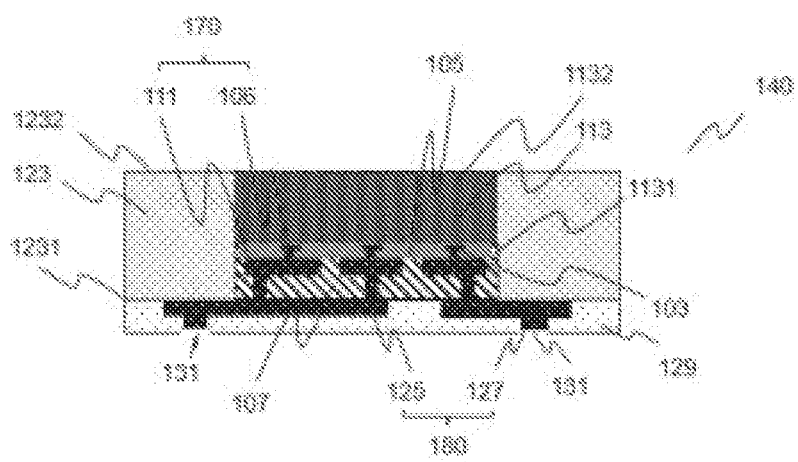
Figure 14D:
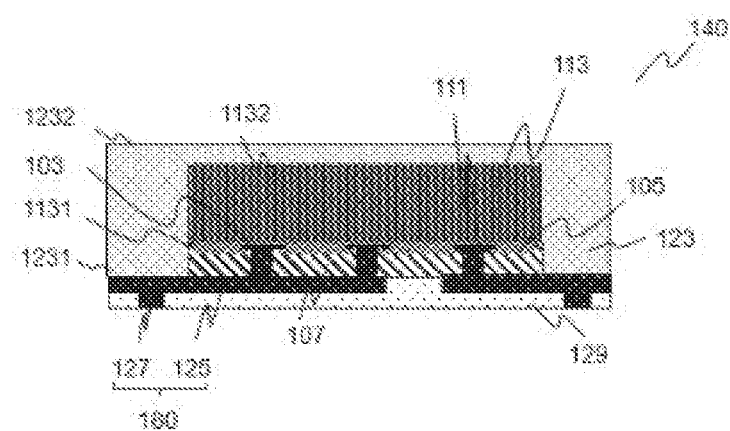

In one embodiment, the conductive trace 125 extends along the surface of the protective layer 107 and the molding layer front surface 1231, and extends to an edge of the chip package body after the packaging is completed; and the packaged chip structure is shown in FIG. 14d. The conductive trace 125 extends to the edge of the chip package body, and in this case, the conductive trace 125 covers and connects interfaces between the protective layer 107 and the molding layer 132, so that stability of the packaged chip structure is increased.

FIG. 11 shows that a conductive stud 127 is formed on a pad or a connection point of the conductive trace 125; the conductive stud 127 for example has a shape of a circle, or may have other shape such as an ellipse, a square, a line and the like. The conductive stud 127 for example is formed of one or more layers of a material such as copper, gold, silver, tin, aluminum and the like, or a combination thereof, or other suitable conductive material by PVD, CVD, sputtering, electrolytic electroplating, electrodeless electroplating, or other suitable metal deposition process.

The panel-level conductive layer comprises the conductive trace 125 and/or the conductive stud 127, and the panel-level conductive layer has one layer or a plurality of layers. The panel-level conductive layer for example has a fan-out RDL function.

Figure 12A:
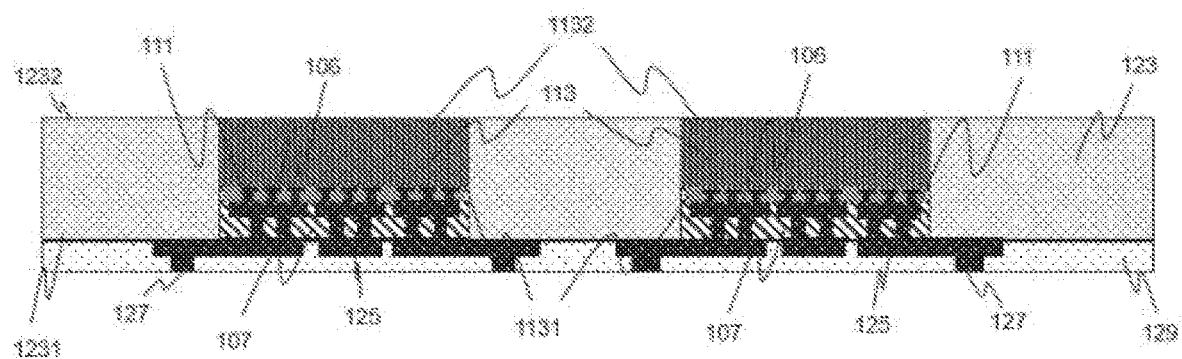
FIG. 12a and FIG. 12b are schematic diagrams of forming a dielectric layer on the panel assembly according to the exemplary embodiment of the present disclosure.

As shown in FIG. 12a, a dielectric layer 129 is formed on the panel-level conductive layer.

One or more dielectric layers 129 are formed on the surface of the panel-level conductive layer by lamination, coating, spraying, printing, molding, or other suitable method.

The dielectric layer 129 for example is made of benzocyclobutene (BCB), polyimide (PI), polybenzoxazole (PBO), Ajinomoto Build up Film (ABF), silicon dioxide, silicon nitride, silicon oxynitride, tantalum pentoxide, aluminum oxide, polymer-based dielectric film, organic polymer film; or is made of an organic composite material, a resin composite material, a macromolecule composite material, a polymer composite material, such as an epoxy resin having a filler, ABF, or other polymer having a suitable filler; or is made of other material having similar insulation and structural properties. In a preferred embodiment, the dielectric layer 129 is made of ABF. The dielectric layer 129 is insulating and plays a role of protecting the conductive layer.

In one embodiment, the dielectric layer 129 is applied to have a thickness that is greater than a thickness of the panel-level conductive layer, and the panel-level conductive layer is exposed by a polishing process; in another embodiment, the dielectric layer 129 is applied to have a thickness that is equal to the thickness of the panel-level conductive layer, so that the panel-level conductive layer is just exposed after the dielectric layer 129 is applied.

In one embodiment, the steps of FIG. 10 to FIG. 12b are repeated to form a plurality of panel-level conductive layers on the die active surface 1131 of the die 113.

Return to steps of FIG. 10 to FIG. 12b. In one embodiment, the step of forming the panel-level conductive layer for example is as follows:

Forming the conductive trace 125 on the die active surface 1131 of the die 113;

Forming one or more dielectric layers 129 on the surface of the conductive trace 125 by lamination, coating, spraying, printing, molding, or other suitable method; a height of the dielectric layer 129 being higher than a height of the conductive trace 125, and the conductive trace 125 being completely encapsulated in the dielectric layer 129;

Forming an opening in the dielectric layer 129 at a position corresponding to the pad or the connection point of the conductive trace 125, and forming the conductive stud 127 in the opening.

In still another embodiment, the conductive stud 127 is not formed in the opening, so that the pad or the connection point of the conductive trace 125 of the completed package body is exposed from the opening.

In a preferred embodiment, after the step of applying the dielectric layer 129, an outermost panel-level conductive layer is etched and thinned, to form a groove 131 on an outer surface of the dielectric layer 129; and the packaged chip structure is as shown in FIG. 14b and FIG. 14c.

Figure 12B:
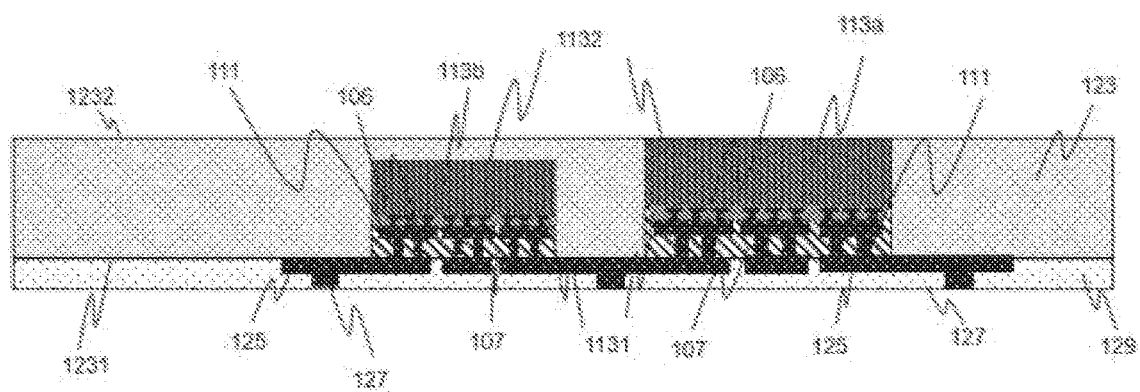
Figure 14E:
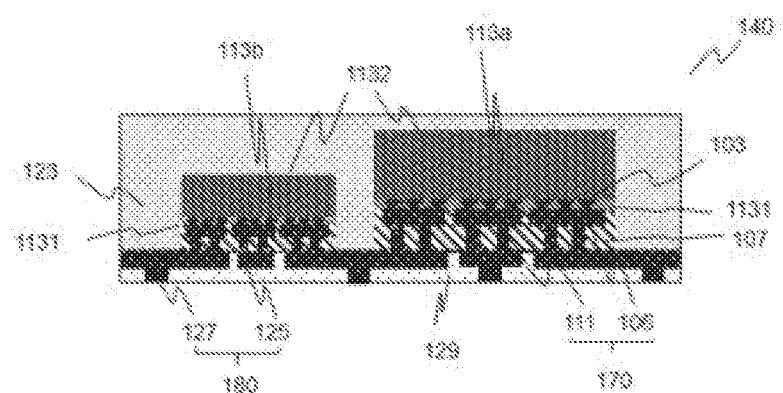

Optionally, as shown in FIG. 12b, in a single packaging process, two dies 113a and 113b, particularly, the two dies 113a and 113b having different functions (which are shown as two in the drawing, or may be more than two dies) are packaged into the multi-chip module, and patterns of the conductive layers of the two dies 113a and 113b are designed according to electrical connection needs of actual products. The packaged chip structure is as shown in FIG. 14e.

Figure 13:
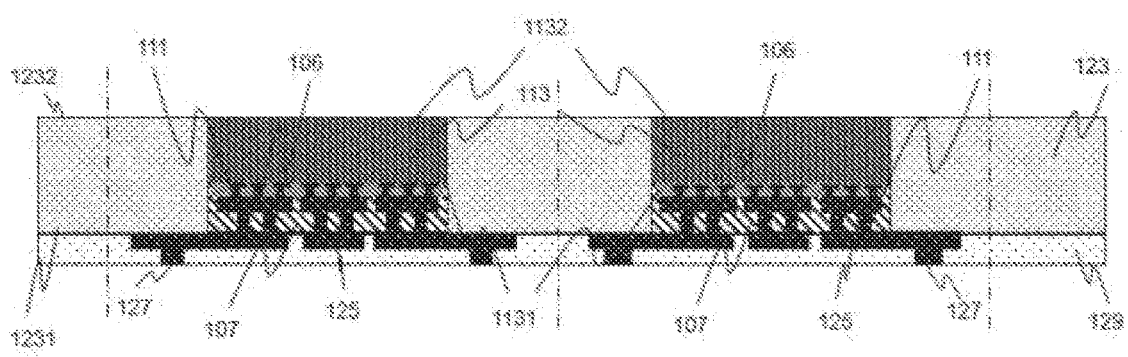

As shown in FIG. 13, the package single body is separated out by cutting to form the packaged chip, and the cutting for example is performed by employing machinery or laser.

Chip package structures may also be provided in the embodiment of the present disclosure. For example, the chip package structures formed using the packaging method described in the above embodiments. Therefore, all the description in the embodiments of the above packaging method are applicable to the chip package structures.

FIG. 14a, FIG. 14b, FIG. 14c, FIG. 14d and FIG. 14e are schematic diagrams of chip package structures obtained by using the packaging method according to the exemplary embodiment of the present disclosure; and as shown in the drawings, the chip package structure comprises: at least one die 113, the die 113 including the die active surface 1131 and the die back surface 1132; a conductive structure, including the wafer conductive layer 170 and the panel-level conductive layer 125, 127; the protective layer 107; the molding layer 123, the molding layer 123 encapsulating the die 113; and the dielectric layer 129.

In some embodiments, the protective layer 107 has the Young's modulus of any numerical range or value below: 1,000 MPa to 20,000 MPa, 1,000 MPa to 10,000 MPa, 4,000 MPa to 8,000 MPa, 1,000 MPa to 7,000 MPa, 4,000 MPa to 7,000 MPa and 5,500 MPa. The protective layer 107 is soft and has good flexibility and elasticity, so that the protective layer 107 provides sufficient support for the panel-level conductive layer 180 formed on its surface, and is especially applicable to the package of the thin die with a large electric flux.

In some embodiments, the protective layer 107 is made of the organic/inorganic composite material. Preferably, the organic/inorganic composite material in which the inorganic particles are added to the organic material is employed, so that the material properties of the organic material is modified and thus the organic/inorganic composite material has properties of both the organic material and the inorganic material.

In some embodiments, the protective layer 107 has the thickness of any numerical range or value below: 15 μm to 50 μm, 20 μm to 50 μm, 35 μm, 45 μm and 50 μm. The thickness range ensures that the protective layer 107 provides sufficient buffering and support.

In some embodiments, the protective layer 107 has the coefficient of thermal expansion of any numerical range or value below: 3 ppm/K to 10 ppm/K, 5 ppm/K, 7 ppm/K and 10 ppm/K.

In some embodiments, the molding layer 123 has the coefficient of thermal expansion of any numerical range or value below: 3 ppm/K to 10 ppm/K, 5 ppm/K, 7 ppm/K and 10 ppm/K.

In some embodiments, the molding layer 123 and the protective layer 107 have a substantially same coefficient of thermal expansion, so that accumulation of interface fatigue at interfaces between the protective layer 107, the molding layer 123 and the die 113 is avoided, the packaged chip becomes durable, and the service life of the chip is prolonged.

In some embodiments, as shown in FIG. 14a, FIG. 14b and FIG. 14c, the wafer conductive layer 170 includes the wafer conductive trace 106 and the wafer conductive stud 111; the die active surface 1131 includes the electrical connection pad 103; at least one of the wafer conductive traces 106 are electrically connected with at least one of the electrical connection pads 103; and the wafer conductive stud 111 is formed on the pad or the connection point of the wafer conductive trace 106.

In some embodiments, as shown in FIG. 14c, at least one of the wafer conductive traces 106 respectively lead out at least a part of the electrical connection pads 103.

In some embodiments, as shown in FIG. 14a and FIG. 14b, each of at least one of the wafer conductive traces 106 interconnects and leads out a plurality of electrical connection pads 103 of at least a part of electrical connection pads 103.

In some embodiments, as shown in FIG. 14d, the wafer conductive layer 170 includes the wafer conductive stud 111; and at least one of the wafer conductive studs 111 are electrically connected with at least a part of the electrical connection pads 103.

In some embodiments, the panel-level conductive layer 180 includes the conductive trace 125 and/or the conductive stud 127; the panel-level conductive layer 180 is electrically connected with wafer conductive stud 111; and the panel-level conductive layer has one or more layers.

In some embodiments, as shown in FIG. 14d and FIG. 14e, at least a part of the conductive traces 125 that are closest to the die active surface 1131 are formed on the molding layer front surface 1231 and extend to the edge of the package body to increase stability of the package body.

In some embodiments, as shown in FIG. 14b and FIG. 14c, the die back surface 1132 is exposed from the molding layer 123, to facilitate heat dissipation of the chip.

In some embodiments, as shown in FIG. 14b and FIG. 14c, the surface of the dielectric layer 129 is provided with the groove at a position corresponding to the conductive layer.

In some embodiments, as shown in FIG. 14e, the at least one die 113 comprises two or more dies 113, and the two or more dies 113 are electrically connected according to product design.

It should be noted that, for the materials, structures or technical effects, etc. which are not mentioned in the descriptions of the package structures, reference may be made to the embodiments of the above packaging methods, and the details are not described herein again.

Figure 15:
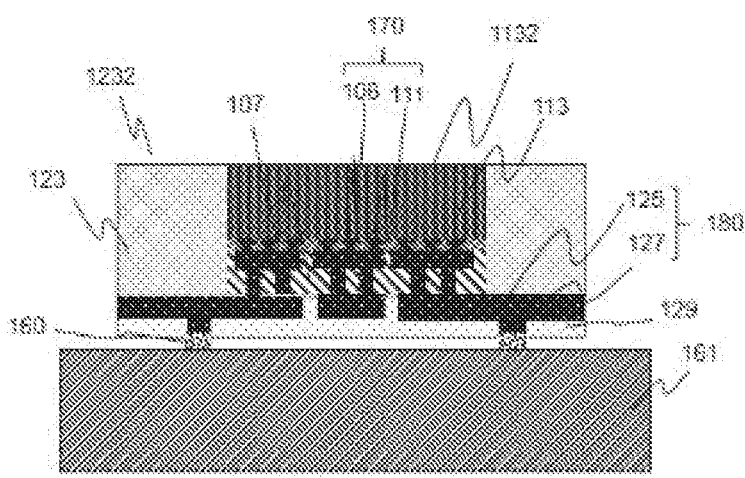
FIG. 15 is a schematic diagram of the packaged chip in use according to the exemplary embodiment of the present disclosure.

FIG. 15 shows a schematic diagram of the packaged chip in use; during the packaged chip is used, the packaged chip is connected to a circuit board or a substrate 161 through a solder 160, and then is connected with other circuit elements.

In the case that the surface of the dielectric layer 129 of the packaged chip has the groove 131, the solder 160 is stably provided and is difficult to shift.

The following examples pertain to various embodiments.

According to some embodiments, The present disclosure is intended to provide a chip packaging method and a chip package structure, and the chip packaging method reduces or eliminates warpage in a panel packaging process, lowers a requirement on an accuracy of aligning a die on a panel, reduces a difficulty in the panel packaging process, and makes a packaged chip structure more durable, and thus the present disclosure is especially suitable for large panel-level package and package of a thin chip with a large electric flux.

At least one embodiment in the present disclosure relates to a package structure, comprising: at least one die, the at least one die including a die active surface and a die back surface; a conductive structure, including a wafer conductive layer and a panel-level conductive layer; a protective layer; a molding layer, the molding layer encapsulating the at least one die; and a dielectric layer.

According to some embodiments, the wafer conductive layer includes wafer conductive traces and wafer conductive studs; the die active surface includes electrical connection pads; at least one of the wafer conductive traces are electrically connected with the electrical connection pads; and the wafer conductive studs are respectively provided on pads or connection points of the wafer conductive traces.

According to some embodiments, at least one of the wafer conductive traces respectively lead out the electrical connection pads.

According to some embodiments, the at least one of the wafer conductive traces interconnects and leads out a plurality of electrical connection pads.

According to some embodiments, the wafer conductive layer includes wafer conductive studs; the die active surface includes electrical connection pads; and at least one of the wafer conductive studs are electrically connected with the electrical connection pads.

According to some embodiments, the panel-level conductive layer includes conductive traces and/or conductive studs; the panel-level conductive layer is electrically connected with the wafer conductive studs; and the panel-level conductive layer has one or more layers.

According to some embodiments, at least a part of the conductive traces that are closest to the die active surface are provided on a molding layer front surface of the molding layer and extend to an edge of the chip package structure.

According to some embodiments, the die back surface is exposed from the molding layer.

According to some embodiments, a surface of the dielectric layer is provided with a groove at a position corresponding to the panel-level conductive layer.

According to some embodiments, the at least one die comprises two or more dies, and the plurality of dies are electrically connected according to product design.

According to some embodiments, the protective layer comprises an organic/inorganic composite material.

According to some embodiments, the protective layer has a Young's modulus of any numerical range or value below: 1,000 MPa to 20,000 MPa, 1,000 MPa to 10,000 MPa, 4,000 MPa to 8,000 MPa and 5,500 MPa.

According to some embodiments, the protective layer has a thickness of any numerical range or value below: 15 μm to 50 μm, 20 μm to 50 μm, 35 μm, 45 μm and 50 μm.

According to some embodiments, the protective layer has a coefficient of thermal expansion of any numerical range or value below: 3 ppm/K to 10 ppm/K, 5 ppm/K, 7 ppm/K and 10 ppm/K.

According to some embodiments, the molding layer has a coefficient of thermal expansion of any numerical range or value below: 3 ppm/K to 10 ppm/K, 5 ppm/K, 7 ppm/K and 10 ppm/K.

According to some embodiments, the protective layer and the molding layer have a substantially same coefficient of thermal expansion.

At least one embodiment in the present disclosure relates to a chip packaging method, comprising: forming a wafer conductive layer on a wafer active surface of a wafer to be packaged; forming a protective layer on the wafer conductive layer, the protective layer encapsulating the wafer conductive layer and exposing a front surface of the wafer conductive layer; separating (such as cutting) the wafer formed with the wafer conductive layer and the protective layer to form a die; attaching (such as adhering) the die onto a carrier, a die active surface of the die facing a carrier front surface of the carrier and a die back surface of the die facing away from the carrier front surface; forming a molding layer on the die back surface on the carrier; removing (such as stripping off) the carrier; forming a panel-level conductive layer electrically connected with the wafer conductive layer; and forming a dielectric layer.

According to some embodiments, the forming the wafer conductive layer comprises: forming wafer conductive traces and forming wafer conductive studs; and the wafer conductive traces are formed such that at least one of the wafer conductive traces respectively lead out electrical connection pads provided on the die and/or the at least one of the wafer conductive traces interconnects and leads out a plurality of electrical connection pads.

According to some embodiments, the forming the wafer conductive layer comprises: forming wafer conductive studs; and at least one of the wafer conductive studs are electrically connected with electrical connection pads provided on the die and leading out the electrical connection pads.

According to some embodiments, the forming the panel-level conductive layer comprises: forming conductive traces and/or conductive studs; and the panel-level conductive layer is formed to be electrically connected with the wafer conductive studs, and the panel-level conductive layer is formed to have one or more layers.

According to some embodiments, the chip packaging method further comprises: thinning the molding layer at a molding layer back surface of the molding layer to expose the die back surface.

According to some embodiments, the chip packaging method further comprises: forming a groove in the dielectric layer and at a position corresponding to the panel-level conductive layer by etching metal.

According to some embodiments, the chip packaging method further comprises: performing plasma surface treatment and/or chemically-promoting modifier treatment on the wafer active surface of the wafer and/or a surface, facing the wafer, of the protective layer.

According to some embodiments, the protective layer is made of an organic/inorganic composite material;

According to some embodiments, the protective layer and the molding layer have a substantially same coefficient of thermal expansion.

According to some embodiments, the protective layer has a Young's modulus of any numerical range or value below: 1,000 MPa to 20,000 MPa, 1,000 MPa to 10,000 MPa, 4,000 MPa to 8,000 MPa and 5,500 MPa;

According to some embodiments, the protective layer has a thickness of any numerical range or value below: 15 μm to 50 μm, 20 μm to 50 μm, 35 μm, 45 μm and 50 μm.

According to some embodiments, the protective layer has a coefficient of thermal expansion of any numerical range or value below: 3 ppm/K to 10 ppm/K, 5 ppm/K, 7 ppm/K and 10 ppm/K.

According to some embodiments, the molding layer has a coefficient of thermal expansion of any numerical range or value below: 3 ppm/K to 10 ppm/K, 5 ppm/K, 7 ppm/K and 10 ppm/K.

The specific embodiments as described above are intended to further explain the technical solutions and technical effects of the present disclosure in detail; but it should be understood by those skilled in the art that the foregoing embodiments merely are specific embodiments, and not intended to limit the present disclosure; any modification, equivalent substitution, improvement and the like, made within the inventive ideas of the present disclosure should be covered within the protection scope of the present disclosure.

What is claimed is:

1. A chip package structure, comprising:
   a panel-level conductive layer, a dielectric layer, a protective layer, a wafer conductive layer, at least one die, and a molding layer, wherein
   the at least one die includes a die active surface and a die back surface and die side surfaces, and the at least one die is arranged in direct contact with the protective layer, wherein the die active surface is configured with electrical connection pads and the die back surface faces away from the die active surface;
   the panel-level conductive layer includes a conductive trace;
   the protective layer is arranged in contact with the panel-level conductive layer and in contact with the at least one die such that the protective layer is disposed on and in direct contact with the die active surface side surfaces of the protective layer are substantially aligned with the die side surfaces;
   the wafer conductive layer is arranged in direct contact with the protective layer;
   the molding layer is arranged to encapsulate the at least one die and the protective layer; and
   the dielectric layer is disposed on the panel-level conductive layer and is in contact with the protective layer and the molding layer; and, wherein
   a first portion of the conductive trace is in direct contact with the wafer conductive layer and a second portion of the conductive trace is in direct contact with the protective layer; and
   the protective layer is configured to prevent the panel-level conductive layer from breaking the at least one die.

2. The chip package structure according to claim 1, wherein
   the wafer conductive layer includes wafer conductive traces and wafer conductive studs, and at least one of the wafer conductive traces further includes wafer connection points; and
   the wafer conductive studs are respectively provided on the wafer connection points.

3. The chip package structure according to claim 2, wherein
   at least one of the wafer conductive studs is electrically connected with at least one of the electrical connection pads via the at least one of the wafer conductive traces.

4. The chip package structure according to claim 2, wherein
   the panel-level conductive layer includes panel-level conductive studs;
   the panel-level conductive layer is electrically connected with the wafer conductive studs; and
   the panel-level conductive layer has one or more layers.

5. The chip package structure according to claim 2, wherein
   the conductive trace further includes panel-level connection points; and
   the panel-level conductive layer further includes a plurality of panel-level conductive studs respectively provided on the panel-level connection points.

6. The chip package structure according to claim 1, wherein the protective layer comprises an organic/inorganic composite material.

7. The chip package structure according to claim 1, wherein the protective layer is configured to have a Young's modulus ranging from 1,000 Mpa to 20,000 Mpa to prevent the panel-level conductive layer from breaking the at least one die.

8. The chip package structure according to claim 1, wherein the protective layer is configured to have a thickness ranging from 15 μm to 50 μm to prevent the panel-level conductive layer from breaking the at least one die.

9. The chip package structure according to claim 1, wherein the protective layer is configured to have a substantially same coefficient of thermal expansion as the molding layer to prevent separation of the protective layer and the at least one die, the coefficient of thermal expansion ranging from 3 ppm/K to 10 ppm/K.

10. The chip package structure according to claim 1, wherein the at least one die comprises two or more dies, and the two or more dies are electrically connected together.

11. The chip package structure according to claim 1, wherein a groove is configured in the dielectric layer at a position corresponding to the panel-level conductive layer for exposing the panel-level conductive layer from the dielectric layer.

12. A chip package structure, comprising:
    at least one die, the at least one die including a die active surface, a die back surface and die side surfaces;

a conductive structure, the conductive structure including a wafer conductive layer and a panel-level conductive layer, wherein the panel-level conducive layer further includes a conductive trace;

a protective layer, the protective layer including protective layer side surfaces, the protective layer being a single layer disposed on and in direct contact with the die active surface, the protective layer side surfaces being substantially aligned with the die side surfaces, wherein the wafer conductive layer is disposed within the protective layer, wherein the protective layer is configured to prevent the panel-level conductive layer from breaking the at least one die;

a molding layer, the molding layer encapsulating the at least one die and the protective layer, wherein the panel-level conductive layer is disposed on and in direct contact with a protective layer front surface of the protective layer; and a dielectric layer, the dielectric layer being disposed on the panel-level conductive layer, the protective layer and a molding layer front surface, wherein the conducive trace includes a single and continuous conductive layer.

13. The chip package structure according to claim 12, wherein the single and continuous conductive layer is in direct contact with the wafer conductive layer and the protective layer within a contour of the at least one die and in direct contact with the molding layer outside the contour of the at least one die.

14. The chip package structure according to claim 12, wherein the panel-level conductive layer further includes a plurality of panel-level conductive studs; and the panel-level conductive studs are electrically connected to the single and continuous conductive layer.

15. The chip package structure according to claim 12, wherein the single and continuous conducive layer is provided on the molding layer front surface and extends to an edge of the chip package structure.

16. A chip package structure, comprising:

at least one die, the at least one die including a die active surface, a die back surface and die side surfaces;

a conductive structure, the conductive structure including a wafer conductive layer and a panel-level conductive layer, wherein the wafer conductive layer further comprises wafer conductive traces in contact with and extending along the die active surface;

a protective layer, the protective layer including protective layer side surfaces, the protective layer being disposed on and in direct contact with the die active surface, the protective layer side surfaces being substantially aligned with the die side surfaces, wherein the wafer conductive layer is disposed within the protective layer, wherein the protective layer is configured to prevent the panel-level conductive layer from breaking the at least one die;

a molding layer, the molding layer encapsulating the at least one die and the protective layer, wherein the panel-level conductive layer is disposed on and in direct contact with a protective layer front surface of the protective layer; and a dielectric layer, the dielectric layer being disposed on the panel-level conductive layer, the protective layer and a molding layer front surface, wherein the dielectric layer is substantially coplanar with the panel-level conductive layer.

17. The chip package structure according to claim 16, wherein the panel-level conductive layer includes panel-level conductive studs; and the dielectric layer is substantially coplanar with the panel-level conductive studs.

18. The chip package structure according to claim 17, wherein a groove is configured in the dielectric layer at a position corresponding to the conductive studs for exposing the conductive studs from the dielectric layer.

19. The chip package structure according to claim 17, wherein at least a part of the conductive trace that is closest to the die active surface is in direct contact with the molding layer front surface and extends to an edge of the chip package structure.

* * * * *